(12) United States Patent
Ni et al.

(10) Patent No.: US 8,691,374 B2
(45) Date of Patent: Apr. 8, 2014

(54) MULTILAYER COATED WEAR-RESISTANT MEMBER AND METHOD FOR MAKING THE SAME

(75) Inventors: Wangyang Ni, Parsippany, NJ (US); Ronald M. Penich, Greensburg, PA (US); Yixiong Liu, Greensburg, PA (US)

(73) Assignee: Kennametal Inc., Latrobe, PA (US)

( * ) Notice: Subject to any disclaimer, the term of this patent is extended or adjusted under 35 U.S.C. 154(b) by 0 days.

(21) Appl. No.: 13/232,076

(22) Filed: Sep. 14, 2011

(65) Prior Publication Data

US 2013/0065081 A1    Mar. 14, 2013

(51) Int. Cl.
B23B 27/14    (2006.01)

(52) U.S. Cl.
USPC .............. 428/216; 51/307; 51/309; 428/336; 428/697; 428/698; 428/699

(58) Field of Classification Search
USPC ............ 51/307, 309; 428/216, 336, 697, 698, 428/699
See application file for complete search history.

(56) References Cited

U.S. PATENT DOCUMENTS

| | | |
|---|---|---|
| 6,884,499 B2 | 4/2005 | Penich et al. |
| 7,060,345 B2 * | 6/2006 | Fukui et al. .................. 428/216 |
| 7,923,130 B2 * | 4/2011 | Shibata et al. ................ 428/697 |

FOREIGN PATENT DOCUMENTS

| | | | |
|---|---|---|---|
| EP | 1939327 A1 | | 7/2008 |
| JP | 11-131215 | * | 5/1999 |
| JP | 2000-297364 | * | 10/2000 |
| JP | 2003-145313 | * | 5/2003 |
| JP | 2007021650 A | | 2/2007 |
| JP | 2011167793 A | | 9/2011 |
| JP | 2011189473 A | | 9/2011 |
| WO | 2011149580 A1 | | 12/2011 |

OTHER PUBLICATIONS

Durand-Drouhin, et al., "Surface & Coatings Technology", "Mechanical properties and failure modes of TiAl(Si)N single and multilayer thin films", vol. 163-164, see whole document, Jan. 30, 2003, pp. 260-266.
Li Chen, et al., "Surface & Coatings Technology", Machining performance of Ti—Al—Si—N coated inserts, vol. 205, see whole document, May 8, 2010, pp. 582-586.
Mattox, Handbook of Physical Vaopr Deposition (PVD) Processing, Society of Vauum Coaters, Albuquerque, New Mexico (1998), pp. 3-4.

* cited by examiner

*Primary Examiner* — A. A. Turner
(74) *Attorney, Agent, or Firm* — Matthew W. Gordon, Esq.

(57) ABSTRACT

A coated wear-resistant member, as well as a method for making the same, includes a substrate and a coating scheme. The coating scheme has a region of alternating coating sublayers. One coating sublayer is $Ti_xAl_ySi_{100-x-y}N$ wherein 40 atomic percent$\leq x \leq$80 atomic percent; 15 atomic percent$\leq y \leq$55 atomic percent; 4 atomic percent$\leq$100-x-y$\leq$15 atomic percent. The other coating sublayer is $Ti_pAl_{100-p}N$ wherein 45 atomic percent$\leq p \leq$100 atomic percent. The method for making a coated wear-resistant member includes the steps of providing the substrate, and depositing the region of alternating coating sublayers.

20 Claims, 9 Drawing Sheets

MULTILAYER COATED WEAR-RESISTANT MEMBER AND METHOD FOR MAKING THE SAME

BACKGROUND OF THE INVENTION

The present invention pertains to a coated wear-resistant member, as well as a method for making a coated wear-resistant member, wherein the coating scheme is applied by physical vapor deposition (PVD). More specifically, the invention pertains to a coated wear-resistant member, as well as a method for making a coated wear-resistant member, wherein the coating scheme is applied by physical vapor deposition (PVD). The coating scheme includes a region with alternating sublayers of titanium aluminum silicon nitride and titanium aluminum nitride.

Physical Vapor Deposition (PVD) processes (often just called thin film processes) are atomistic deposition processes in which material is vaporized from a solid source and transported in the form of a vapor through a vacuum or low pressure gaseous (or plasma) environment to the substrate where it condenses. Typically, PVD processes are used to deposit films with thicknesses in the range of a few nanometers to thousands of nanometer; however they can also be used to form multilayer coatings, graded composition deposits, very thick deposits and freestanding structures. PVD processes can be used to deposit films of elements and alloys as well as compounds using reactive deposition processes. In reactive deposition processes, compounds are formed by the reaction of depositing material with the ambient gas environment such as nitrogen (e.g. titanium nitride, TiN). See Donald M. Mattox, *Handbook of Physical Vapor Deposition (PVD) Processing*, Society of Vacuum Coaters, Albuquerque, N. Mex. (1998), pp. 3-4.

Heretofore, coated wear-resistant members have been used in many applications wherein resistance to wear is a desirable property. Typically, a coated wear-resistant member comprises a substrate and a coating scheme on the substrate. The coating scheme may comprise a single coating layer or, in the alternative, it may comprise a plurality of coating layers. In many instances, the coating scheme provides the wear resistant property. One exemplary wear-resistant member is a coated cutting tool useful for the removal of material (e.g., metal) from a workpiece. Coated cutting tools include without limitation coated cutting inserts, coated end mills, coated drills, coated taps, and coated reamers. Metal forming is another area of use for a coated wear-resistant member. Such a coated wear component may be a coated drawing die or the like. The coated wear-resistant member has other tribological applications such as, for example, valve bodies, dies and punches.

In an application in which a coated wear-resistant member is desirable to use, it is advantageous for the coating scheme to exhibit an optimal level of hardness. In this regard, the hardness reflects the ability of the coating scheme to provide wear resistance to the coated wear-resistant member. Thus, there is a general desire to use a coating scheme that exhibits an optimal hardness wherein the coating scheme is not too brittle, but has sufficient hardness to provide wear-resistant properties. In an application in which a coated wear-resistant member is desirable to use, it is advantageous for the coating scheme to exhibit an acceptable level of adhesion to the substrate. In this regard, the ability of the coating scheme to adhere to the substrate typically results in an increase in the overall useful life of the coated wear-resistant member.

It can thus be seen that it would be desirable to provide a wear-resistant member that has a coating scheme, which exhibits a certain optimal hardness. Further, it can thus be seen that it would be desirable to provide a wear-resistant member that has a coating scheme, which exhibits an acceptable level of adhesion. It can also been that it would be desirable to provide a wear-resistant member that exhibits a certain optimal hardness in combination with an acceptable level of adhesion of the coating to the substrate. The overall goal is to provide such a coated wear-resistant member that exhibits improved performance properties in applications such as metalcutting, metal forming, and other tribological applications.

SUMMARY OF THE INVENTION

In one form thereof, the invention is a coated wear-resistant member that comprises a substrate, which has a substrate surface, and a coating scheme. The coating scheme comprises a region with alternating coating sublayers with one coating sublayer being $Ti_xAl_ySi_{100-x-y}N$ wherein 40 atomic percent$\leq x \leq$80 atomic percent; 15 atomic percent$\leq y \leq$55 atomic percent; 4 atomic percent$\leq$100-x-y$\leq$15 atomic percent, and other coating sublayer being $Ti_pAl_{100-p}N$ wherein 45 atomic percent$\leq p \leq$100 atomic percent. As an option, the coating scheme may further include at least one bonding region.

In another form thereof, the invention is a method for making a coated wear-resistant member comprising the steps of: providing a substrate having a substrate surface; and depositing a region of alternating coating sublayers with one coating sublayer being $Ti_xAl_ySi_{100-x-y}N$ wherein 40 atomic percent$\leq x \leq$80 atomic percent; 15 atomic percent$\leq y \leq$55 atomic percent; 4 atomic percent$\leq$100-x-y$\leq$15 atomic percent, and other coating sublayer being $Ti_pAl_{100-p}N$ wherein 45 atomic percent$\leq p \leq$100 atomic percent. As an option, the method may further include the step of depositing at least one bonding region.

BRIEF DESCRIPTION OF THE DRAWINGS

The following is a brief description of the drawings that form a part of this patent application.

DETAILED DESCRIPTION

Figure 1:
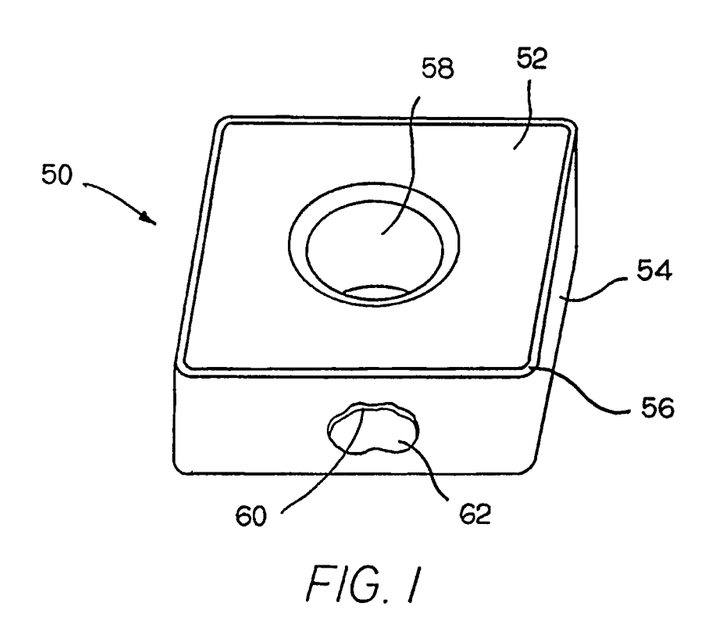
FIG. 1 is an isometric view of a CNMG432-MP style of coated cutting insert.

Referring to the drawings, FIG. 1 is an isometric view of a specific embodiment of a coated cutting insert generally designated as 50. Coated cutting insert 50 has a rake surface 52, a flank surface 54 and a cutting edge 56 at the intersection of the rake surface 52 and the flank surface 54. The coated cutting insert 50 has a central aperture 58, which facilitates the attachment of the cutting insert 50 to a tool holder. Coated cutting insert 50 exhibits a CNMG432-MP geometry per the ANSI Standard.

The coated cutting insert 50 comprises a coating scheme 60 and a substrate 62. FIG. 1 shows that a portion of the coating scheme 60, which has been removed to show the substrate 62. The substrate 62 can comprise any one of a number of materials. Exemplary materials for the substrate 62 include without limitation cemented carbides (e.g., cobalt cemented tungsten carbide), cermets, high-speed steels, ceramics, polycrystalline cubic boron nitride (PcBN), and polycrystalline diamond (PCD). The coating layers has been deposited via physical vapor deposition (PVD). Although the specific examples of the inventive coating scheme use a cathodic arc deposition PVD technique, other PVD techniques are suitable to apply the inventive coating scheme.

Figure 2:
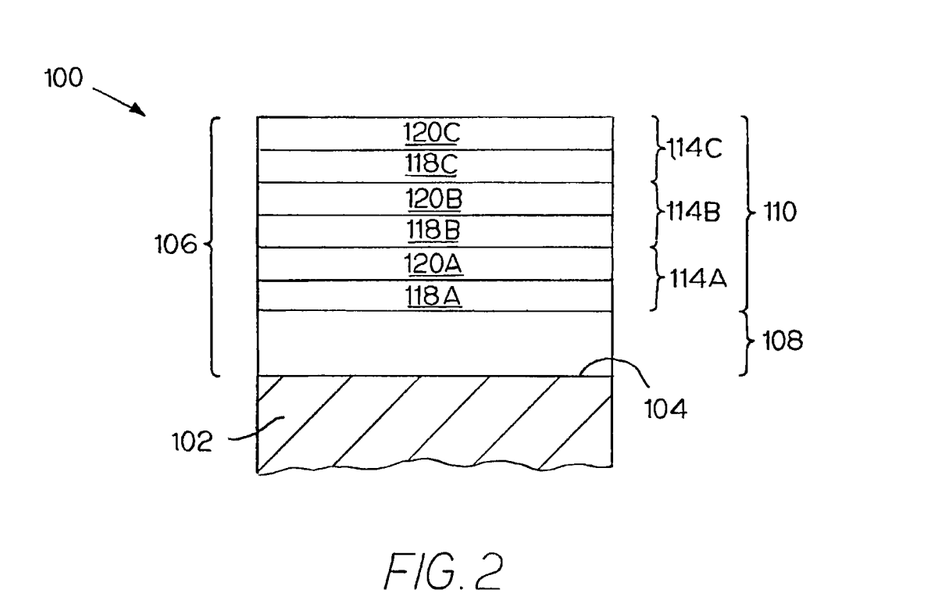
FIG. 2 is a diagrammatic view of one specific embodiment of a coating scheme on a substrate in which the coating scheme comprises a bonding coating region and a plurality of coating sets comprises alternating sublayers of titanium aluminum silicon nitride and titanium aluminum nitride which is a region of alternating coating sublayers.

FIG. 2 is a diagrammatic view of another coated cutting insert generally designated as 100. Coated cutting insert 100 comprises a substrate 102, which has a surface 104, and a coating scheme shown by bracket 106. Coating scheme 106 is on the surface 104 of the substrate 102. Coating scheme 106 comprises a bonding coating region shown by bracket 108 and a region of alternating coating sublayers shown by bracket 110. As will become apparent, the region of alternating coating sublayers comprises a plurality of coating sets comprising alternating coating sublayers. The bonding coating region 108 is mediate of the substrate surface and the region of alternating coating sublayers 110. The region of alternating coating sublayers 110 is on top of the bonding coating region 108. In the specific embodiment, the bonding coating region 108 can be any one of two alternatives as described below.

In the first alternative, bonding coating region is a single layer of $Ti_pAl_{100-p}N$ wherein $45 \leq p \leq 100$. As another option of the composition, the composition can be $Ti_pAl_{100-p}N$ wherein $45 \leq p \leq 65$. In reference to the thickness of the single layer of $Ti_pAl_{100-p}N$, the thickness of the single coating layer of titanium aluminum nitride can range between about 0.05 micrometers and about 4 micrometers. As an alternative, the thickness of the single layer of $Ti_pAl_{100-p}N$ can range between about 0.2 micrometers and about 4 micrometers.

In the second alternative, the bonding coating region comprises a plurality of bonding coating sets wherein each bonding coating set comprises alternating bonding coating sublayers of TiN and $Ti_pAl_{100-p}N$ (i.e., $TiN/Ti_pAl_{100-p}N$) wherein $45 \leq p \leq 100$. As another option of the composition of the titanium aluminum nitride, the composition can be $Ti_pAl_{100-p}N$ wherein $45 \leq p \leq 65$.

In reference to the thickness parameters pertaining to the second alternative of the bonding coating region, the thickness of the coating layer of titanium nitride can range between about 0.002 micrometers and about 0.05 micrometers. As an alternative, the thickness of the coating layer of titanium nitride can range between about 0.002 micrometers and about 0.025 micrometers. The thickness of the coating layer of titanium aluminum nitride can range between about 0.002 micrometers and about 0.05 micrometers. As an alternative, the thickness of the coating layer of titanium aluminum nitride can range between about 0.002 micrometers and about 0.025 micrometers. The thickness of each coating set (TiN/$Ti_pAl_{100-p}N$) can range between about 0.004 micrometers and about 0.1 micrometers. As an alternative, the thickness of the coating set (TiN/$Ti_pAl_{100-p}N$) can range between about 0.004 micrometers and about 0.05 micrometers. The total thickness of TiN/$Ti_pAl_{100-p}N$ bonding region can range between greater than about zero micrometers and about 4 micrometers.

The region of alternating coating sublayers (TiAlSiN/TiAlN) 110 comprises a plurality of coating sets (114A, 114B, 114C) wherein each coating set comprises a sublayer (118A, 118B, 118C) of titanium aluminum silicon nitride ($Ti_xAl_ySi_{100-x-y}N$, $40 \leq x \leq 80$; $15 \leq y \leq 55$; $4 \leq 100-x-y \leq 15$) and a sublayer (120A, 120B, 120C) of titanium aluminum nitride ($Ti_pAl_{100-p}N$, $45 \leq p \leq 100$), wherein the coating composition is specified in atomic percent. There are number of options when it comes to the composition of the titanium aluminum silicon nitride coating layer, and there are a number of options for the composition of the titanium aluminum nitride coating layer. The total coating thickness of this alternating TiAlSiN/TiAlN coating region 110 ranges from 1 micrometer to 6 micrometer.

In reference to the composition of the titanium aluminum silicon nitride ($Ti_xAl_ySi_{100-x-y}N$) coating layer, one option is ($Ti_xAl_ySi_{100-x-y}N$) 50 atomic percent $\leq x \leq 70$ atomic percent; 20 atomic percent $\leq y \leq 40$ atomic percent; 7 atomic percent $\leq 100-x-y \leq 10$ atomic percent). A second option is ($Ti_xAl_ySi_{100-x-y}N$) 55 atomic percent $\leq x \leq 65$ atomic percent; 25 atomic percent $\leq y \leq 35$ atomic percent; 8 atomic percent $\leq 100-x-y \leq 9$ atomic percent). In reference to the composition of the titanium aluminum nitride ($Ti_pAl_{100-p}N$, $45 \leq p \leq 100$) coating layer, one option is $Ti_pAl_{100-p}N$, wherein 45 atomic percent $\leq p \leq 65$ atomic percent. Another option is $Ti_pAl_{100-p}N$, wherein p=100 atomic percent.

In reference to the thickness parameters for the coating layers 118A-C and 120A-C, The thickness of the coating layer of titanium aluminum silicon nitride can range between about 0.002 micrometers and about 0.05 micrometers. As an alternative, the thickness of the titanium aluminum silicon nitride coating layer can range between about 0.002 micrometers and about 0.025 micrometers. The thickness of the coating layer of titanium aluminum nitride can range between about 0.002 micrometers and about 0.05 micrometers. As an alternative, the thickness of the titanium aluminum nitride coating layer can range between about 0.002 micrometers and about 0.025 micrometers. In reference to the thickness of the coating sets (114A-114C), the thickness of the coating set can range between about 0.004 micrometers and about 0.05 micrometers. As an alternative, the thickness of the coating set can range between about 0.004 micrometers and about 0.025 micrometers.

For the titanium-aluminum-silicon-nitrogen coating, the coating crystal structure is face centered cubic (f.c.c.), or a mixture of f.c.c. and hexagonal close pack phase (h.c.p phase). The phase constitution is determined by selected area diffraction (SADP) using transmission electron microscope (TEM).

Figure 3:
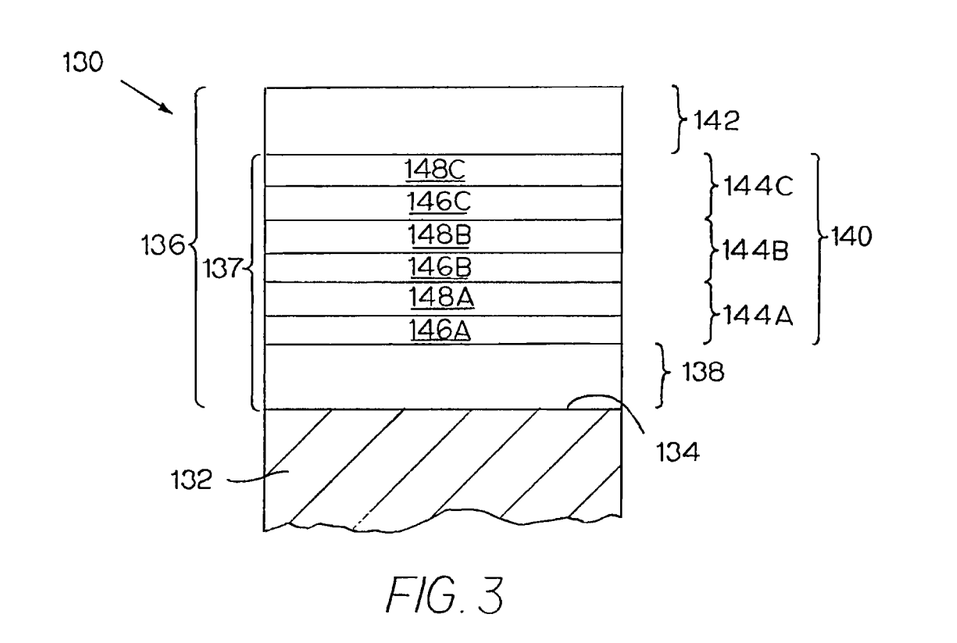
FIG. 3 is a diagrammatic view of a specific embodiment coating scheme on a substrate in which the coating scheme comprises a titanium aluminum nitride bonding layer, a plurality of coating sets comprising alternating sublayers of titanium aluminum silicon nitride and titanium aluminum nitride, which is a region of alternating coating sublayers, and a top coating region of a single layer of titanium aluminum silicon nitride.

FIG. 3 is a diagrammatic view of another coated cutting insert generally designated as 130. Coated cutting insert 130 comprises a substrate 132, which has a surface 134, and an overall coating scheme shown by bracket 136. Coating scheme 136 is on the surface 134 of the substrate 132. Coating scheme 136 includes a coating scheme shown by brackets 137 that is essentially the same as the overall coating scheme 106 of the embodiment of FIG. 2. The description of the corresponding coating regions in FIG. 2 is applicable to the description of the appropriate coating regions in FIG. 3. Coating scheme 137 includes a bonding coating region shown by bracket 138, a region of alternating coating sublayers shown by bracket 140. The overall coating scheme 136 further includes a top coating region shown by bracket 142. The bonding coating region is mediate of the substrate surface and the region of alternating coating sublayers region. The region of alternating coating sublayers is on the bonding coating region.

In reference to top coating region 142, the coating layer comprises titanium aluminum silicon nitride ($Ti_xAl_ySi_{100-x-y}N$, $40 \leq x \leq 80$; $15 \leq y \leq 55$; $4 \leq 100-x-y \leq 15$). In reference to the composition of the titanium aluminum silicon nitride ($Ti_xAl_ySi_{100-x-y}N$) coating layer, one option is ($Ti_xAl_ySi_{100-x-y}N$) $50 \leq x \leq 70$; $20 \leq y \leq 40$; $7 \leq 100-x-y \leq 10$). A second option is ($Ti_xAl_ySi_{100-x-y}N$) $55 \leq x \leq 65$; $25 \leq y \leq 35$; $8 \leq 100-x-y \leq 9$). For the titanium-aluminum-silicon-nitrogen coating, the coating crystal structure is face centered cubic (f.c.c.), or a mixture of f.c.c. and hexagonal close pack phase (h.c.p phase). The phase constitution is determined by selected area diffraction (SADP) using transmission electron microscope (TEM). The thickness of the coating layer of titanium aluminum silicon nitride can range between greater than about zero micrometers and about 3 micrometers. As an alternative, the thickness of the titanium aluminum silicon nitride coating layer can range between about 0.2 micrometers and about 2 micrometers.

In this work, the cathodic arc deposition method is used to deposit the coatings. The coating chamber was pumped down to a pressure equal to about $1 \times 10^{-3}$ Pa. The parts, i.e., substrates to be coated, were then heated up to a temperature equal to about 550° C. using a radiation heater. In these examples, the substrate comprised of tungsten carbide containing about 6% cobalt and about 0.4% chromium. The surfaces of each substrate was cleaned by argon etching using a DC voltage of about −50 volts to about −200 volts in an argon pressure equal to about 0.2 Pa.

Powder metallurgical targets of titanium-aluminum-silicon and titanium-aluminum were used in a reactive atmosphere of nitrogen (or nitrogen in an inert gas) to deposit the titanium-aluminum-silicon-nitrogen coating and titanium-aluminum-nitrogen coatings layers. The chemistry, i.e., composition, of the coating layers was controlled by using titanium-aluminum-silicon and titanium-aluminum targets of different compositions. The working pressure to deposit each coating layer was within the range of between about 0.5 Pa to about 6 Pa.

There were six different coating compositions of the titanium-aluminum-silicon-nitrogen coating. The substrate for each one of the coating was: cemented tungsten carbide containing about 6% cobalt and about 0.4% chromium. Table I below sets forth the content of the titanium, aluminum and silicon components in each one of the six coatings. The overall coating has a composition according to the following formula (In atomic percent): $Ti_xAl_ySi_{(100-x-y)}N$ wherein x and y are in atomic percent of the sum of the titanium, aluminum, and silicon contents. The composition of the coating layers was measured by EDS technique using SEM.

TABLE I

Composition of Coating No. 1 through No. 6

| Coating No. | Ti (at %) | Al (at %) | Si (at %) | Si + Al (at %) |
|---|---|---|---|---|
| 1 | 73.0 | 19.8 | 7.2 | 27.0 |
| 2 | 67.2 | 24.3 | 8.6 | 32.9 |
| 3 | 63 | 28.6 | 8.5 | 36.6 |
| 4 | 57.9 | 33.5 | 8.6 | 42.1 |
| 5 | 52.3 | 38.6 | 9.2 | 47.8 |
| 6 | 47.3 | 43.8 | 8.9 | 52.7 |

Table II below sets forth properties for each one of the Coating Nos. 1 through 6. The term "f.c.c." means face-centered cubic, and the term "h.c.p." means hexagonal close-packed.

TABLE II

Properties of Coating Layers No. 1 through No. 6

| Coating Layer No. | Hardness (GPa) | Young's Modulus (GPa) | Crystal Structure |
|---|---|---|---|
| 1 | 32.8 | 471 | f.c.c |
| 2 | 34.9 | 456 | f.c.c. |
| 3 | 36.6 | 474 | f.c.c |
| 4 | 34.2 | 427 | f.c.c |
| 5 | 31.0 | 386 | f.c.c |
| 6 | 27.0 | 328 | f.c.c and h.c.p mixture |

The hardness and Young's modulus are reported in gigapascals (GPa), and were measured using a nanoindenter using ISO 14577-1 standard procedure. The crystal structure is reported and was determined by transmission electron microscope (TEM).

Figure 4:
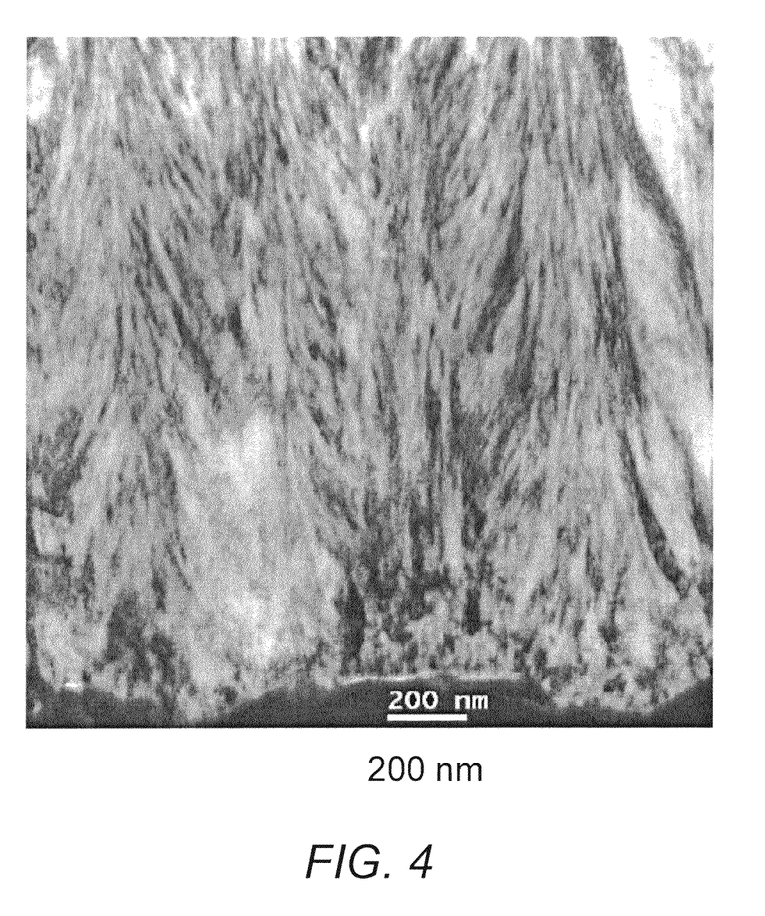
FIG. 4 is a TEM photomicrograph via transmission electron microscopy (TEM), which has a scale of 200 nanometers (nm), of a part of the No. 2 TiAlSiN coating scheme.
Figure 5:
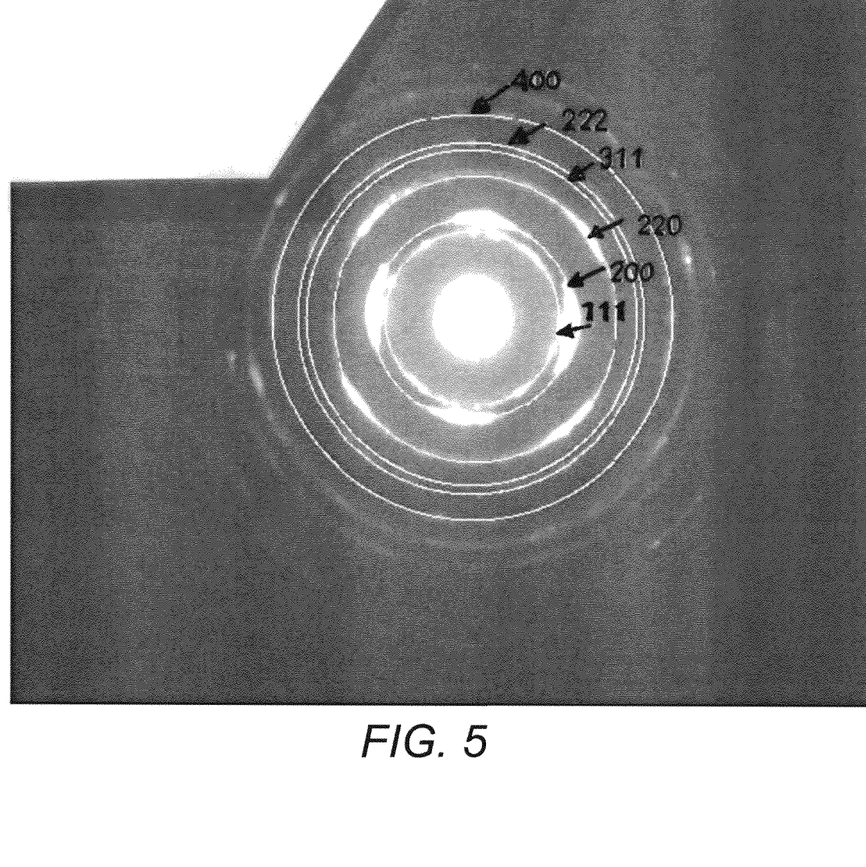
FIG. 5 is a selected area diffraction pattern (SADP) for the No. 2 TiAlSiN coating scheme wherein the calculated lattice parameter for the f.c.c. structure is 0.422±0.001 nanometers.

The composition and properties of Coating No. 2 are set forth in Table I and Table II above. FIG. 4 is a TEM photomicrograph via transmission electron microscopy (TEM) of a part of the Coating No 2. FIG. 5 is a selected area diffraction pattern (SADP) for the Coating No 2, which reveals that this coating consists of a single phase of face centered cubic (f.c.c.) crystal structure.

Figure 6:
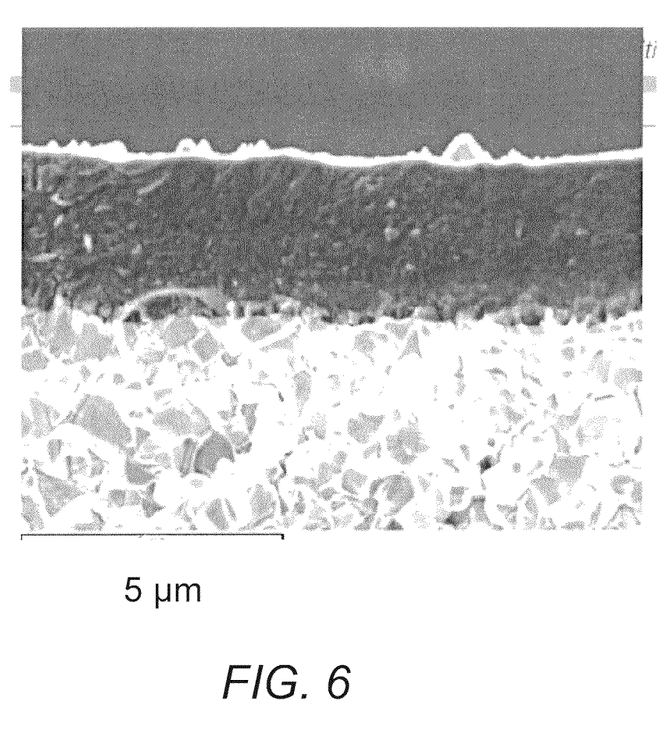
FIG. 6 is a SEM photomicrograph, which has a scale of 5 µm, of a cross-section of the No. 4 TiAlSiN coating scheme.
Figure 10:
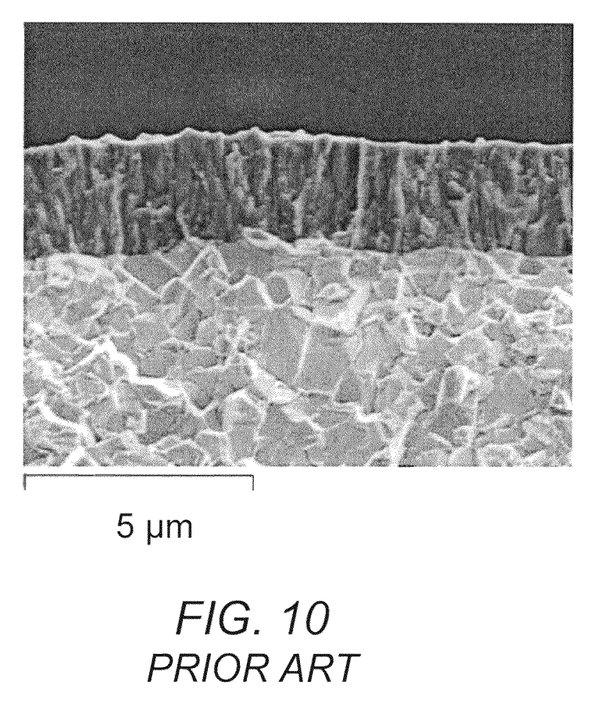
FIG. 10 is a photomicrograph, which has a scale of 5 μm, of a cross-section of the PRIOR ART commercial Ti56Al44N coating wherein the commercial Ti56Al44N coating layer has a hardness equal to 28.7 GPa.

The composition and properties of Coating No. 4 are set forth in Table I and Table II above. FIG. 6 is a SEM photomicrograph of a cross-section of the Coating No 4. A comparison of the Coating No. 4 (Ti57.9Al33.5Si8.6N) (see FIG. 6) against the prior art Ti56Al44N coating, which is described above and shown in FIG. 10, shows that the addition of silicon helps reduce the grain size of the coating. The prior art Ti56Al44N coating has a hardness equal to 28.7 GPa. A reduction in the grain size of the coating leads to an increase in the hardness of the coating according to the Hall-Petch relationship.

Figure 7:
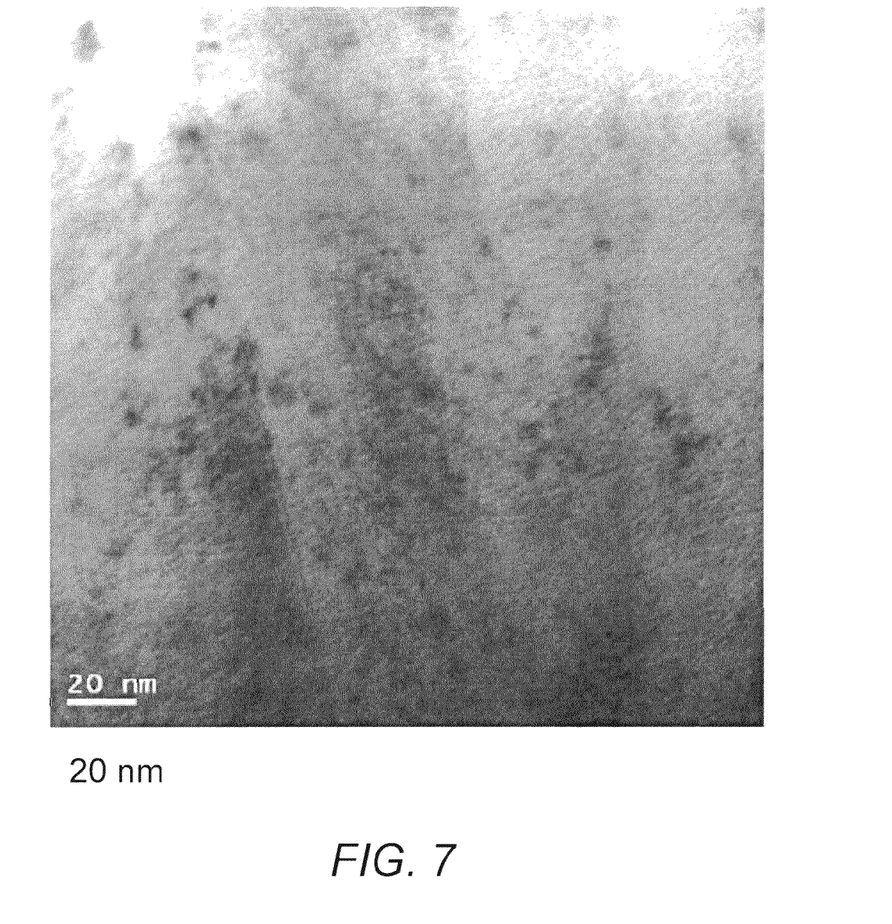
FIG. 7 is a TEM photomicrograph via transmission electron microscopy (TEM), which has a scale of 20 nanometers (nm), of a part of the No. 6 TiAlSiN coating scheme.
Figure 8:
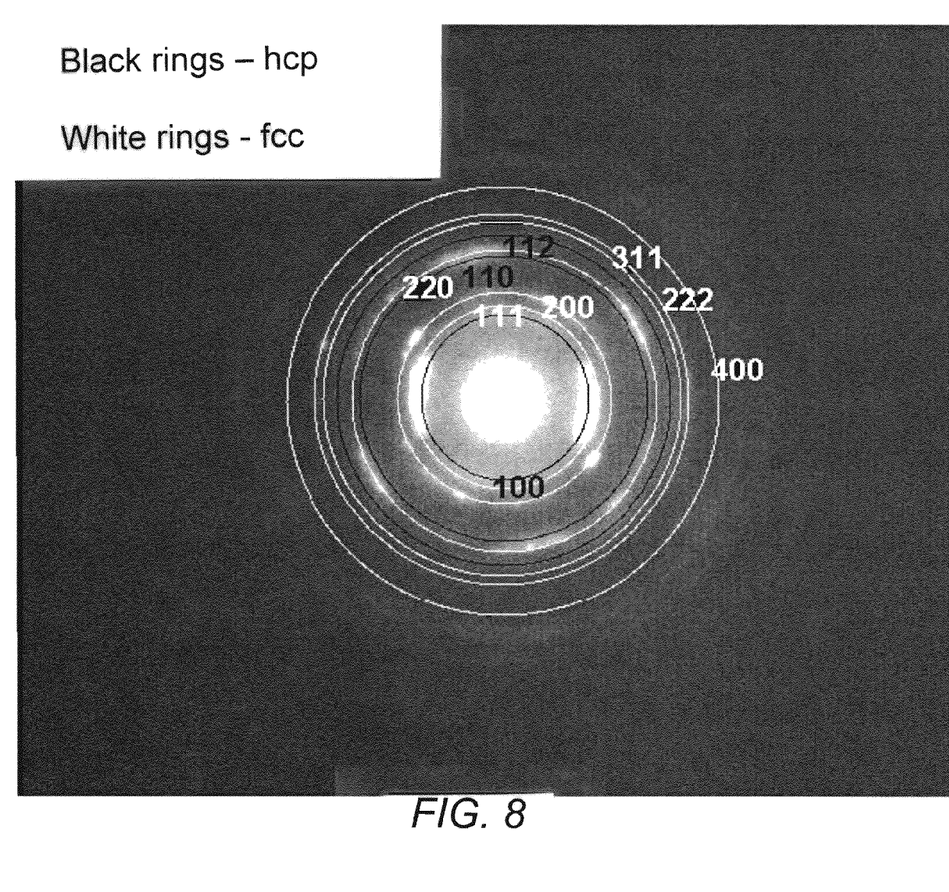
FIG. 8 is a selected area diffraction pattern (SADP) for the No. 6 TiAlSiN coating scheme.

The composition and properties of Coating No. 6 are set forth in Table I and Table II above. FIG. 7 is a photomicrograph via transmission electron microscopy (TEM) of a part of the Coating No. 6. FIG. 8 is a selected area diffraction pattern (SADP) for the Coating No. 6. FIG. 8 shows that hexagonal phase is present when the aluminum and silicon contents are high.

Coatings No. 1-6 have excellent hardness, however, these coatings can possibly flake off on sharp cutting edges when deposited as a single layer. Coating adhesion can be improved by (1) adding Si free bonding layers such as TiN, TiAlN and/or mixture layer of TiN/TiALN; and (2) alternating TiAlSiN coating and TiAlN coating. Referring to Table III, Coatings Nos. 8-13 show coatings that have at least one bonding region and alternating TiAlSlN/TiAlN coating region. Coating No. 7 is a commercial prior art AlTiN coating shat is being used for turning and milling applications. Coatings Nos. 8 through 13 shows higher hardness than the commercial (prior art) coating No. 7. In Table III, the hardness and Young's modulus are reported in gigapascals (GPa), and were measured using a nanoindenter using ISO 14577-1 standard procedure.

cutting conditions are set forth below: speed=198 meters/minute; feed=0.2 millimeters/revolution; depth of cut=2.03 mm doc; insert style CNMG432-MP; lead angle=−5 degrees; coolant=flood. The end of life criteria were 0.3 mm wear on the cutting insert flank surface. The commercial coating No. 7 failed after 18.4 minutes. Coating No 11 failed after 26.2 minutes of cutting, while the Coatings Nos. 9, 10 and 12 do not reach the failure criteria after 30 minutes of cutting.

Third comparative tests in the continuous turning of 304 stainless steel were conducted comparing the commercial Al61Ti39N coating layer against Coating Layer No. 13. The cutting conditions are set forth below: speed=250 meters/

TABLE III

Structure and Properties of Coating Layers Nos. 7-13.

| Coating No. | Coating description | 1$^{st}$ Bonding Coating Region (thickness in μm) | 2$^{nd}$ Bonding Coating Region (Thickness in μm) | Alternating TiAlSlN/TiAlN Coating Region (Thickness in μm) | Hardness (GPa) | Young's modulus (GPa) |
|---|---|---|---|---|---|---|
| 7 (commercial coating) | Al61Ti39N single layer (3 μm) (commercial) | Not Applicable | Not Applicable | Not Applicable | 28.3 | 428 |
| 8 (IN#213) | AlTiSiN multilayer 1 | TiN (0.2 um) | Alternating TiN/Ti56Al44N (0.8 um) | Alternating Ti56Al44N/Ti63Al28.6Si8.5N [coating #3 in Table 1] (2 um) | 32.2 | 524 |
| 9 (IN#243) | AlTiSiN multilayer 2 | TiN (0.2 um) | Alternating TiN/Ti51Al49N (0.8 um) | Alternating Ti51Al49N/Ti63Al28.6Si8.5N [coating #3 in Table 1] (2 um) | 33.1 | 486 |
| 10 (IN#244) | AlTiSiN multilayer 3 | TiN (0.2 um) | Alternating TiN/Ti51Al49N (0.8 um) | Alternating Ti51Al49N/Ti57.9Al33.5Si8.6N [coating #4 in Table 1] (2 um) | 32 | 492 |
| 11 (IN#245) | AlTiSiN multilayer 4 | TiN (0.2 um) | Alternating TiN/Ti51Al49N (0.8 um) | Alternating Ti51Al49N/Ti52.3Al38.6Si9.2N [coating #5 in Table 1] (2 um) | 30.1 | 447 |
| 12 (IN#246) | AlTiSiN multilayer 5 | TiN (0.2 um) | Alternating TiN/Ti51Al49N (0.8 um) | Alternating Ti51Al49N/Ti67.2Al24.3Si8.6N [coating #2 in Table 1] (2 um) | 32.4 | 484 |
| 13 (IN#251) | AlTiSiN multilayer 6 | Ti51Al49N (1.5 um) | none | Alternating Ti51Al49N/Ti63Al28.6Si8.5N [coating #3 in Table 1] (1.5 um) | 33.4 | 500 |

For Coating Nos. 7 through 13, there is no top TiAlSiN coating region.

Figure 9:
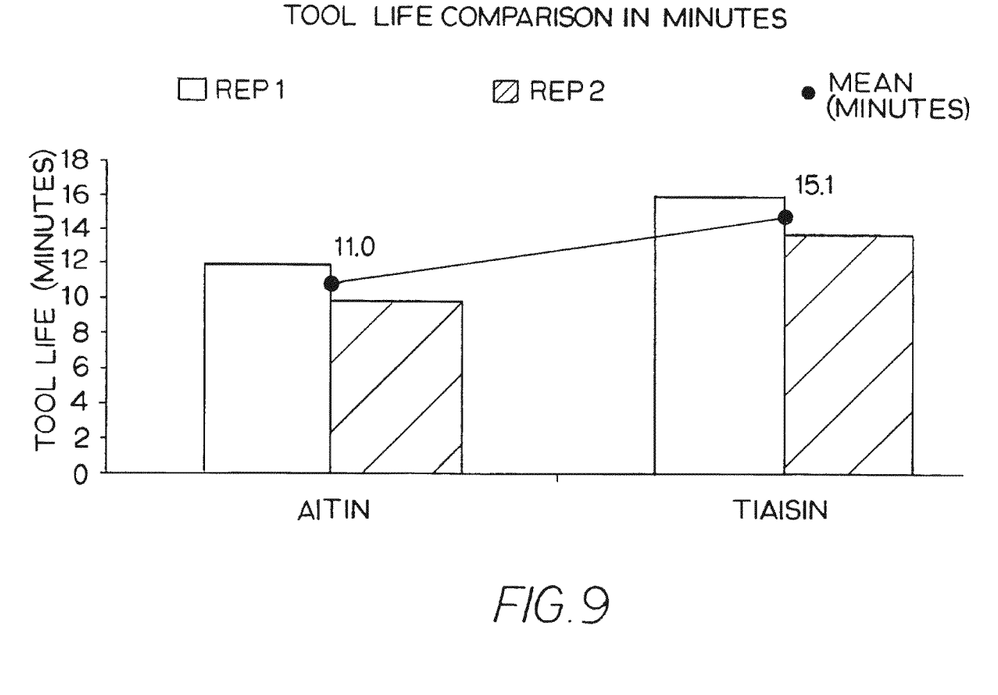
FIG. 9 is a bar graph showing the metal cutting test results of a prior art commercial cutting insert and an embodiment of an inventive cutting insert.

First comparative tests in the continuous turning of 304 stainless steel were conducted comparing the commercial Al61Ti39N coating layer against Coating Layer No. 8. The cutting conditions are set forth below: speed=250 meters/minute; feed=0.25 millimeters/revolution; depth of cut=2.03 mm doc; insert style CNMG432-MP; lead angle=−5 degrees; coolant=flood. The end of life criteria were 0.3 mm wear on the cutting insert flank surface. FIG. 9 is a bar graph showing the metal cutting test results of a prior art commercial cutting insert and an embodiment of an inventive cutting insert. As can been seen from the bar graph (FIG. 9), there is a 37 percent increase in tool life using Coating Layer No. 8 as compared to the commercial cutting insert using the Al61Ti39N coating.

Second comparative tests in the continuous turning of 304 stainless steel were conducted comparing the commercial Al61Ti39N coating layer against Coating Layer No. 8. The cutting conditions are set forth below: speed=198 meters/minute; feed=0.2 millimeters/revolution; depth of cut=2.03 mm doc; insert style CNMG432-MP; lead angle=−5 degrees; coolant=flood. The end of life criteria were 0.3 mm wear on the cutting insert flank surface. The commercial coating Al61Ti39N failed after 8 minutes of cutting, while the Coating No. 13 lasts 13.1 minutes.

It is apparent from the above description that the inventive coating layers provide a wear-resistant member that exhibits a certain optimal hardness. Further, it can thus be seen that the inventive coating layers provide a wear-resistant member has a coating which exhibits an acceptable level of adhesion. It can also been that the inventive coating layers provide a wear-resistant member that exhibits a certain optimal hardness in combination with an acceptable level of adhesion of the coating to the substrate. It is apparent that the inventive coating layers provide a wear-resistant member which achieves the overall goal to provide a coated wear-resistant member that exhibits improved performance properties.

Here, the specific wear-resistant member is a coated cutting insert. However, there should be an appreciation that there is the expectation that the improved properties would exists in other kinds of wear-resistant members (e.g., punches, die and mold) The patents and other documents identified herein are hereby incorporated in their entirety by reference herein. Other embodiments of the invention will be apparent to those skilled in the art from a consideration of the specification or a practice of the invention disclosed herein. There is the intention that the specification and examples are illustrative only and are not intended to be limiting on the scope of the invention. The following claims indicate the true scope and spirit of the invention.

What is claimed:
1. A coated wear-resistant member comprising:
   a substrate having a substrate surface; and
   a coating scheme comprising a region of alternating coating sublayers comprising a plurality of coating sets, each one of the coating sets comprising one coating sublayer being $Ti_xAl_ySi_{100-x-y}N$ wherein 40 atomic percent$\leq$x$\leq$80 atomic percent; 15 atomic percent$\leq$y$\leq$55 atomic percent; 4 atomic percent$\leq$100$-$x$-$y$\leq$15 atomic percent, and other coating sublayer being $Ti_pAl_{100-p}N$ wherein 45 atomic percent$\leq$p$\leq$100 atomic percent, and wherein x is not equal to y.

2. The coated wear-resistant member of claim 1 wherein the one coating sublayer $Ti_xAl_ySi_{100-x-y}N$ having the following composition: 50 atomic percent$\leq$x$\leq$70 atomic percent; 20 atomic percent$\leq$y$\leq$40 atomic percent; 7 atomic percent$\leq$100$-$x$-$y$\leq$10 atomic percent.

3. The coated wear-resistant member of claim 1 wherein the one coating sublayer $Ti_xAl_ySi_{100-x-y}N$ having the following composition: 55 atomic percent$\leq$x$\leq$65 atomic percent; 25 atomic percent$\leq$y$\leq$35 atomic percent; 8 atomic percent$\leq$100$-$x$-$y$\leq$9 atomic percent.

4. The coated wear-resistant member according to claim 1 wherein x is between about 65 atomic percent and about 75 atomic percent, y is between about 15 atomic percent and about 25 atomic percent, and 100$-$x$-$y is between about 5 atomic percent and about 10 atomic percent.

5. The coated wear-resistant member according to claim 1 wherein x is between about 60 atomic percent and about 65 atomic percent, y is between about 22 atomic percent and about 26 atomic percent, and 100$-$x$-$y is between about 6 atomic percent and about 10 atomic percent.

6. The coated wear-resistant member according to claim 1 wherein x is between about 50 atomic percent and about 60 atomic percent, y is between about 30 atomic percent and about 40 atomic percent, and 100$-$x$-$y is between about 7 atomic percent and about 11 atomic percent.

7. The coated wear-resistant member according to claim 1 wherein x is between about 45 atomic percent and about 50 atomic percent, y is between about 40 atomic percent and about 45 atomic percent, and 100$-$x$-$y is between about 7 atomic percent and about 10 atomic percent.

8. The coated wear-resistant member of claim 1 wherein the other coating sublayer $Ti_pAl_{100-p}N$ having the following composition: 45 atomic percent 65 atomic percent.

9. The coated wear-resistant member of claim 1 wherein the other coating sublayer $Ti_pAl_{100-p}N$ having the following composition: p equal to 100 atomic percent.

10. A coated wear-resistant member comprising:
    a substrate having a substrate surface;
    a coating scheme comprising a region of alternating coating sublayers comprising a plurality of coating sets, each one of the coating sets comprising one coating sublayer being $Ti_xAlSi_{100-x-y}N$ wherein 40 atomic percent$\leq$x$\leq$80 atomic percent; 15 atomic percent$\leq$y$\leq$55 atomic percent; 4 atomic percent$\leq$100$-$x$-$y$\leq$15 atomic percent, and other coating sublayer being $Ti_pAl_{100-p}N$ wherein 45 atomic percent$\leq$p$\leq$100 atomic percent; and
    wherein the coating scheme further comprises a bonding coating region mediate of the substrate surface and the region of alternating coating sublayers.

11. The coated wear-resistant member of claim 10 wherein the bonding coating region comprising one of following bonding coating region alternatives: (A) a single bonding coating layer of $Ti_pAl_{100-p}N$ wherein 45 atomic percent$\leq$p$\leq$100 atomic percent, or (B) a plurality of bonding coating sets wherein each bonding coating set comprises alternating bonding coating sublayers of titanium nitride and $Ti_pAl_{100-p}N$ wherein 45 atomic percent$\leq$p$\leq$100 atomic percent.

12. The coated wear-resistant member of claim 11 wherein the thickness of the bonding coating region ranges from 0.2 micrometer to 4 micrometers.

13. The coated wear-resistant member of claim 10 wherein the bonding coating region comprising one of following bonding coating region alternatives: (A) a single bonding coating layer of $Ti_pAl_{100-p}N$ wherein 45 atomic percent$\leq$p$\leq$65 atomic percent, or (B) a plurality of bonding coating sets wherein each bonding coating set comprises alternating bonding coating sublayers of titanium nitride and $Ti_pAl_{100-p}N$ wherein 45 atomic percent$\leq$p$\leq$65 atomic percent.

14. The coated wear-resistant member of claim 10 wherein the coating scheme further comprising a single top coating layer of $Ti_xAl_ySi_{100-x-y}N$ wherein 40 atomic percent$\leq$x$\leq$80 atomic percent; 15 atomic percent$\leq$y$\leq$55 atomic percent; 4 atomic percent$\leq$100$-$x$-$y$\leq$15 atomic percent.

15. The coated wear-resistant member of claim 14 wherein the bonding coating region being on the substrate surface, the region of alternating coating sublayers being on the bonding coating region, and the top coating layer of $Ti_xAl_ySi_{100-x-y}N$ being on the region of alternating coating sublayers.

16. The coated wear-resistant member of claim 1 wherein for the region of alternating coating sublayers, the one coating sublayer of titanium aluminum silicon nitride has a thickness between about two nanometers and about fifty nanometers, and the other coating sublayer of titanium aluminum nitride has a thickness between about two nanometers and about fifty nanometers.

17. The coated wear-resistant member of claim 1 wherein the thickness of the region of alternating coating sublayers ranges from 1 micrometer to 6 micrometers, and wherein the thickness of each coating sublayer of $Ti_xAl_ySi_{100-x-y}N$ ranges from 0.002 micrometer to 0.05 micrometer, and the thickness of each coating sublayer of $Ti_pAl_{100-p}N$ ranges from 0.002 micrometer to 0.05 micrometer.

18. The coated wear-resistant member of claim 1 wherein for the region of alternating coating sublayers the one coating sublayer of titanium aluminum silicon nitride exhibiting a face centered cubic crystal structure, or in the alternative, a mixture of face centered cubic phase and hexagonal close-packed phase.

19. The coated wear-resistant member of claim 1 having a hardness as measured by a nanoindenter using ISO 14577-1 standard procedure equal to be about 30 GPa and about 35 GPa, and a Young's Modulus as measured by a nanoindenter using ISO 14577-1 standard procedure equal to be about 420 GPa and about 550 GPa.

20. The coated wear-resistant member of claim 1 wherein the wear-resistant member is a cutting insert, the cutting insert having a rake face and a flank face, the rake face and the flank face intersect to form a cutting edge.

* * * * *